US011836575B2

(12) United States Patent
Babbush et al.

(10) Patent No.: US 11,836,575 B2
(45) Date of Patent: Dec. 5, 2023

(54) ERROR CORRECTED VARIATIONAL ALGORITHMS

(71) Applicant: Google LLC, Mountain View, CA (US)

(72) Inventors: Ryan Babbush, Venice, CA (US); Austin Greig Fowler, Reseda, CA (US)

(73) Assignee: Google LLC, Mountain View, CA (US)

( * ) Notice: Subject to any disclaimer, the term of this patent is extended or adjusted under 35 U.S.C. 154(b) by 426 days.

(21) Appl. No.: 17/278,137

(22) PCT Filed: Sep. 25, 2018

(86) PCT No.: PCT/US2018/052662
§ 371 (c)(1),
(2) Date: Mar. 19, 2021

(87) PCT Pub. No.: WO2020/068052
PCT Pub. Date: Apr. 2, 2020

(65) Prior Publication Data
US 2021/0334691 A1     Oct. 28, 2021

(51) Int. Cl.
*G06F 5/16* (2006.01)
*G06F 30/20* (2020.01)
*G06F 30/337* (2020.01)
*G06F 30/373* (2020.01)
*G06F 30/398* (2020.01)
*G06N 10/40* (2022.01)
*G06N 10/60* (2022.01)
(Continued)

(52) U.S. Cl.
CPC ............ *G06N 10/00* (2019.01); *G06F 15/16* (2013.01); *G06F 30/20* (2020.01); *G06F 30/337* (2020.01); *G06F 30/373* (2020.01); *G06F 30/398* (2020.01); *G06N 10/40* (2022.01)

(58) Field of Classification Search
CPC ........ G06F 15/16; G06F 30/20; G06F 30/337; G06F 30/373; G06F 30/398; G06N 10/00; G06N 10/40; G06N 10/60
USPC ..................... 716/136, 100, 132, 104; 703/14
See application file for complete search history.

(56) References Cited

U.S. PATENT DOCUMENTS 10,354,198 B1 * 7/2019 Filipp ................. H03K 19/1952
10,374,612 B1 * 8/2019 Sinclair ................. H01L 29/127
(Continued)

FOREIGN PATENT DOCUMENTS

WO    WO 2020068052    4/2020

OTHER PUBLICATIONS

Office Action in Australian Appln. No. 2018442815, dated Mar. 2, 2022, 3 pages.
(Continued)

*Primary Examiner* — Phallaka Kik
(74) *Attorney, Agent, or Firm* — Fish & Richardson P.C.

(57) ABSTRACT

Methods, systems and apparatus for approximating a target quantum state. In one aspect, a method for determining a target quantum state includes the actions of receiving data representing a target quantum state of a quantum system as a result of applying a quantum circuit to an initial quantum state of the quantum system; determining an approximate quantum circuit that approximates the specific quantum circuit by adaptively adjusting a number of T gates available to the specific quantum circuit; and applying the determined approximate quantum circuit to the initial quantum state to obtain an approximation of the target quantum state.

17 Claims, 6 Drawing Sheets

(51) Int. Cl.
  *G06N 10/00* (2022.01)
  *G06F 15/16* (2006.01)

(56) References Cited

U.S. PATENT DOCUMENTS

| | | | | |
|---|---|---|---|---|
| 2007/0288684 | A1* | 12/2007 | Bergou | B82Y 10/00 |
| | | | | 711/101 |
| 2018/0096085 | A1* | 4/2018 | Rubin | G16C 10/00 |
| 2019/0164034 | A1* | 5/2019 | Gambetta | G06N 3/047 |
| 2020/0005186 | A1* | 1/2020 | Romero | G06N 10/00 |
| 2020/0057957 | A1* | 2/2020 | Johnson | G06N 10/20 |
| 2020/0394547 | A1* | 12/2020 | Cao | G06N 10/20 |
| 2020/0412369 | A1* | 12/2020 | Jiang | G06N 10/40 |
| 2021/0027188 | A1* | 1/2021 | Nickerson | G06N 10/00 |
| 2021/0174236 | A1* | 6/2021 | Babbush | G06N 10/20 |
| 2021/0271477 | A1* | 9/2021 | Jiang | G06N 10/00 |

OTHER PUBLICATIONS

Office Action in Australian Appln. No. 2018442815, dated Apr. 27, 2022, 4 pages.
Notice of Allowance in Australian Appln. No. 2018442815, dated Sep. 26, 2022, 6 pages.
Office Action in Canadian Appln. No. 3,114,183, dated Mar. 30, 2023, 5 pages.
Notice of Allowance in European Appln. No. 18783313.2, dated Feb. 13, 2023, 9 pages.
Office Action in European Appln. No. 18783313.2, dated Oct. 13, 2022, 5 pages.
Amy et al., "T-count optimization and Reed-Muller codes," IEEE Transactions on Information Theory, Mar. 2019, 65(8):4771-84.
Heyfron et al., "An efficient quantum compiler that reduces T count" arXiv, Jun. 2018, 19 pages.
PCT International Search Report and Written Opinion in International Appln No. PCT/US2018/052662, dated Jun. 27, 2019, 15 pages.
Welch et al., "On the synthesis of quantum circuits for diagonal operators in quantum computation" Thesis for PhD in Physics at Harvard University, Dec. 4, 2012, 128 pages.
Office Action in Canadian Appln. No. 3,114,183, dated May 27, 2022, 5 pages.
PCT International Preliminary Report on Patentability in International Application No. PCT/US2018/052662, dated Apr. 8, 2021, 9 pages.

* cited by examiner

200

```
┌─────────────────────────────────────┐
│ Receive data representing target    │
│ quantum state of system of qubits   │
│ as the result of applying a         │
│ quantum circuit to an initial       │
│ quantum state of the system of      │
│ qubits                              │
│                                 202 │
└─────────────────────────────────────┘
                  │
                  ▼
┌─────────────────────────────────────┐
│ Determine approximate quantum       │
│ circuit by performing variational   │
│ algorithm that adaptively adjusts   │
│ number of T gates available to      │
│ quantum circuit                     │
│                                 204 │
└─────────────────────────────────────┘
                  │
                  ▼
┌─────────────────────────────────────┐
│ Apply determined approximate        │
│ parameterized quantum circuit to    │
│ initial quantum state to obtain an  │
│ approximation of the target quantum │
│ state                               │
│                                 206 │
└─────────────────────────────────────┘
```

```
┌─────────────────────────────────────────┐
│ Determine fixed total number of T gates │
│ available to quantum circuit            │
│                                     602 │
└─────────────────────────────────────────┘
                    │
                    ▼
┌─────────────────────────────────────────┐
│ Perform discrete optimization routine to assign │
│ particular configuration of T gates to the      │
│ quantum circuit                             604 │
└─────────────────────────────────────────┘
```

*FIG. 6*

ERROR CORRECTED VARIATIONAL ALGORITHMS

CROSS-REFERENCE TO RELATED APPLICATION

This application is a National Stage Application under 35 U.S.C. § 371 and claims the benefit of International Application No. PCT/US2018/052662, filed Sep. 25, 2018. The disclosure of the foregoing application is hereby incorporated by reference in its entirety.

BACKGROUND

This specification relates to quantum computing.

Quantum computing devices use quantum-mechanical phenomena such as superposition and entanglement to perform operations on data. Quantum computing devices operate using two-level quantum mechanical systems called qubits. For example, the circuit model for quantum computation performs quantum computations by applying sequences of quantum logic gates on an n-qubit register.

SUMMARY

This specification describes systems and methods for applying variational algorithms within error correction codes.

In general, one innovative aspect of the subject matter described in this specification can be implemented in a method for approximating a target quantum state, the method comprising: receiving data representing a target quantum state of a quantum system as a result of applying a quantum circuit to an initial quantum state of the quantum system; determining an approximate quantum circuit approximating the specific circuit by adaptively adjusting a number of T gates available to the quantum circuit; and applying the determined approximate quantum circuit to the initial quantum state to obtain an approximation of the target quantum state.

Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations determining an approximate quantum circuit by adaptively adjusting a total number of T gates available to the quantum circuit comprises: assigning an initial number of T gates to the quantum circuit; and iteratively increasing the initial number of T gates assigned to the quantum circuit until termination criteria are met.

In some implementations iteratively increasing the number of T gates assigned to the quantum circuit, comprises, for each iteration: determining a number of T gates for the iteration, the number of T gates for the iteration being larger than the number of T gates for the previous iteration; generating one or more updated quantum circuits for the iteration using the determined number of T gates for the iteration, wherein each updated quantum circuit corresponds to a different assignment of the determined number of T gates within the updated quantum circuit; determining, for each updated quantum circuit, an energy expectation value of the quantum system for the iteration using the updated quantum circuit; identifying a lowest determined energy expectation value of the quantum system; determining whether the difference between the lowest determined energy expectation value for the iteration and a lowest determined energy expectation value for the previous iteration exceeds a predetermined threshold; and in response to determining that the difference exceeds the predetermined threshold, performing a subsequent iteration.

In some implementations the method further comprises, in response to determining that the difference does not exceed the predetermined threshold, approximating the quantum circuit using a T gate assignment that corresponds to a lowest energy expectation value for the previous iteration.

In some implementations determining an approximate quantum circuit by adaptively adjusting a total number of T gates available to the quantum circuit comprises: assigning an initial number of T gates to the quantum circuit; and iteratively decreasing the initial number of T gates assigned to the quantum circuit until termination criteria are met.

In some implementations iteratively decreasing the number of T gates available to the quantum circuit comprises, for each iteration: determining a number of T gates for the iteration, the number of T gates for the iteration being smaller than the number of T gates for the previous iteration; generating one or more updated quantum circuits for the iteration using the determined number of T gates for the iteration, wherein each updated quantum circuit corresponds to a different assignment of the determined number of T gates within the updated quantum circuit; determining, for each updated quantum circuit, an energy expectation value of the quantum system for the iteration using the updated quantum circuit; identifying a lowest determined energy expectation value of the quantum system; determining whether the difference between the lowest determined energy expectation value for the iteration and a lowest determined energy expectation value for the previous iteration exceeds a predetermined threshold; and in response to determining that the difference does not exceed the predetermined threshold, performing a subsequent iteration.

In some implementations the method further comprises, in response to determining that the difference exceeds the predetermined threshold, approximating the quantum circuit using a T gate assignment that corresponds to a lowest energy expectation value for the previous iteration.

In some implementations the method further comprises performing a variational algorithm to determine an adjusted quantum circuit that, when applied to the initial quantum state, approximates the ground state of the quantum system, and wherein determining an approximate quantum circuit by adaptively adjusting a number of T gates available to the quantum circuit comprises: determining the approximate quantum circuit by adaptively adjusting a number of T gates available to the adjusted quantum circuit.

In some implementations adaptively adjusting a number of T gates available to the adjusted quantum circuit comprises: determining respective distances between (i) values of circuit parameters, and (ii) variationally adjusted values of circuit parameters; and determining a T gate assignment that reduces one or more of the determined distances.

In some implementations the distances comprise L2 norms.

In some implementations determining an approximate quantum circuit by adaptively adjusting a number of T gates available to the quantum circuit comprises: fixing the total number of T gates available to the quantum circuit; performing a discrete optimization routine to assign a particular configuration of the fixed total number of T gates to the adjusted circuit parameters.

In some implementations the discrete optimization routine comprises simulated annealing.

In some implementations the quantum circuit comprises one T factory storing physical qubits for implementing T gates.

In some implementations applying the determined approximate quantum circuit to the initial quantum state to obtain an approximation of the target quantum state comprises using the T factory to implement T gates in series.

The disclosed subject matter can be implemented in particular ways so as to realize one or more of the following advantages.

A system implementing error corrected variational algorithms, as described in this specification, can require low spatial (number of physical qubits per logical qubit) overhead. In particular, since variational algorithms are typically low-depth, in many cases quantum computations or operations can be performed by the described system in series, necessitating only one or perhaps a few T factories. Since T factories often include a number of qubits that is on the order of half a million physical qubits, the system described in this specification can achieve a large reduction in computational resources required to perform quantum computations. In addition, a system implementing error corrected variational algorithms, as described in this specification, can perform quantum computations with low spatial overhead whilst maintaining high computation accuracy. The system therefore provides the possibility for practical and reliable error-corrected quantum computing with less than a million physical qubits.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2 is a flow diagram of an example process for determining a target quantum state.

FIG. 6 is a flow diagram of an example process for directly adjusting T gate assignments using discrete optimization techniques.

Like reference numbers and designations in the various drawings indicate like elements.

DETAILED DESCRIPTION

Figure 1:
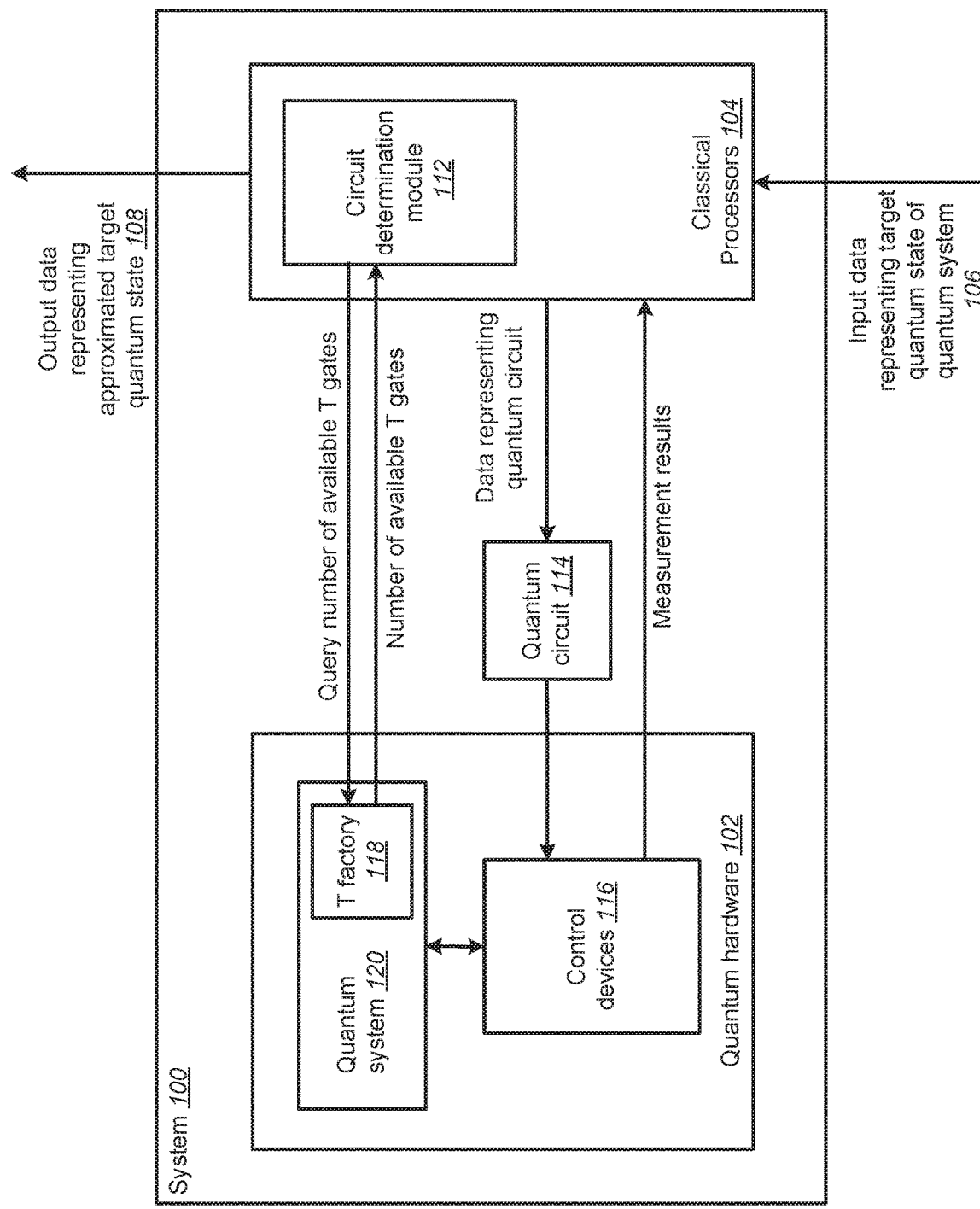
FIG. 1 shows a block diagram of an example system for performing quantum computations.

Quantum error correction codes are used in quantum computing to protect quantum computations from errors due to decoherence and other quantum noise, as well as errors associated with faulty quantum gates, faulty quantum state preparation and faulty quantum measurements. Typically, quantum error correction codes include encoding logical qubits into multiple physical qubits that are more robust to errors. For example, in some cases hundreds of physical qubits may be required to encode one error-corrected logical qubit. Quantum computations are then performed by directly applying logical operations to the encoded physical qubits in such a manner that decoding is not required.

For example, a given quantum computation may require application of a corresponding quantum circuit to the physical qubits, e.g., that are prepared in some initial state. The quantum circuit may include multiple rotation operations, with each rotation operation including a respective rotation angle (herein also referred to as a circuit parameter). Each rotation operation may be implemented using a universal set of quantum logic gates. An example universal gate set is the Clifford+T gate set. A subset of this universal gate set includes Clifford gates–Hadamard gates, CNOT gates and S=diag($1, e^{i\pi/2}$) gates. The universal gate set further includes a non-Clifford gate–T=diag($1, e^{i\pi/4}$) gates.

Conventional systems and methods for implementing quantum circuit rotation operations predefine a target precision with which to implement the rotation operations, and based on the predefined precision, determine corresponding sequences of quantum logic gates, e.g., sequences of Hadamard and T gates, that implement the rotation operations. The length of the sequences of Hadamard and T gates depend on the particular rotation operations and the predefined target precision.

T gates are non-Clifford gates that are relatively costly to implement, e.g., compared to Clifford quantum logic gates. For example, implementing a T gate requires the production and consumption of an ancilla quantum state. Implementing a T gate therefore requires additional physical qubits. Because of this need for additional physical qubits, quantum devices using quantum error correction schemes that implement the above described universal gate set typically include "T factories" of physical qubits that may be used to implement T gates. Each T factory may include hundreds of thousands of physical qubits. Since quantum algorithms typically require a large number of precise rotation operations to be performed, in turn requiring a large number of T gates, the total number of physical qubits included in a quantum device implementing the error correction scheme can become impractical or infeasible.

This specification describes systems and methods for performing a variational quantum algorithm within an error correcting code to reduce the number of physical qubits required to perform quantum computations.

The presently disclosed systems and methods differ to conventional systems and methods for implementing error correction schemes that lock in high costs by predefining a target precision with which to implement quantum circuit rotation operations. The predefined target precision defines sequences of gates necessary to implement the quantum circuit rotation operations at the target precision and produce a target quantum state, e.g., that encodes a solution to a computational task.

Instead, the presently disclosed systems and method predefine an initial total number of T gates. This in turn defines a set of discrete rotations that can be implemented exactly and to produce a corresponding quantum state when applied to an initial quantum state. The initial total number of T gates is then adaptively adjusted to determine a final T gate assignment that defines a set of discrete rotations that can be implemented exactly to produce a final quantum state that is an approximation to (or equal to) the target quantum state.

Example Operating Environment

FIG. 1 depicts an example system 100 for performing quantum computations. The example system 100 is an example of a system implemented as classical or quantum computer programs on one or more classical computers or quantum computing devices in one or more locations, in which the systems, components, and techniques described below can be implemented.

The system 100 includes quantum hardware 102 in data communication with one or more classical processors 104.

The system 100 may receive as input data representing a target state of a quantum system, e.g., input data 106. The target quantum state of the quantum system may be a quantum state that is the result of applying a specific quantum circuit to an initial quantum state of the quantum system. For example, the target quantum state may correspond to a ground state of a Hamiltonian, e.g., in machine learning and quantum simulation settings. In this example the specific quantum circuit represents unitary evolution of the quantum system under the Hamiltonian. The data representing the target state may include data specifying properties of the target state and/or how to achieve the target state, e.g., data specifying a Hamiltonian and indicating which of multiple Hamiltonian eigenstates the target state corresponds to.

The system 100 may generate as output data representing an approximation of the target quantum state, e.g., output data 108. The generated output data may be provided for further processing or analyzing. For example, in cases where the target quantum state is a ground state of a Hamiltonian characterizing a physical system such as a material, e.g., a metal, the generated output data may be used to determine properties of the material, e.g., its conductivity, as part of a materials science process.

The system 100 is configured to perform classical computations in combination with quantum computations using quantum hardware 102 and classical processors 104.

The classical processors 104 may include components for performing classical computations. For example, the classical processors 104 may include modules, e.g., circuit determination module 112, that are configured to process the input data representing the target quantum state of the quantum system 106.

Processing the input data 106 may include determining an approximate quantum circuit that, When applied to the initial state of the quantum system, produces a quantum state that is sufficiently close to the target quantum state. Determined quantum circuits may include sequences of quantum logic gates, e.g., sequences of Hadamard and T gates, that implement specific rotation operations that are applied to qubits in the quantum system. The classical processors 104 may then transmit data representing the determined approximate quantum circuit to the quantum hardware 102.

To determine an approximate quantum circuit that produces a quantum state that is sufficiently close to the target quantum state, the circuit determination module 112 may query the quantum hardware to determine how many T gates are available to the quantum circuit. The circuit determination module 112 may then adaptively adjust the number of available T gates to determine the approximate quantum circuit.

To adaptively adjust the number of available T gates, the classical processors 104 may define an initial number of T gates, e.g., a predetermined minimum number of T gates that is less than the available number of T gates, and iteratively generate quantum circuits that include an increasing number of T gates. This may include, at each iteration, determining a number of T gates for the iteration and determining a quantum circuit that includes a particular assignment of the determined number of T gates for the iteration, e.g., using quantum circuit design techniques and algorithms. The classical processors 104 may then transmit data representing the determined quantum circuit to the quantum hardware 102. As described in more detail below, the quantum hardware 102 may be configured to generate the determined quantum circuit, e.g., quantum circuit 114, using control devices 116 and T factories 118. The quantum hardware 102 may further be configured to apply the determined quantum circuit to the quantum system 120 to evolve the state of the quantum system 120 from an initial state to an evolved state.

The quantum hardware 102 may be further configured to measure the quantum system 120 after application of the determined quantum circuit to obtain an energy expectation value of the quantum system for the iteration. The quantum hardware 102 may provide the classical processors 104 with data representing the measurement results. The classical processors 104 may process the received data by comparing the measurement result for the iteration with a lowest determined energy expectation value for the quantum system. If the difference between the measurement result for the iteration and the lowest determined energy expectation value for the quantum system exceeds the predetermined threshold, the circuit determination module 112 may be configured to perform another iteration with an increased number of T gates. If the difference does not exceed the predetermined threshold, the circuit determination module 112 may select the determined quantum circuit for the iteration as the approximate quantum circuit.

Alternatively, adaptively adjusting the number of available T gates may include defining an initial number of T gates, e.g., the available number of T gates, and iteratively generating quantum circuits that include an decreasing number of T gates. Processes for determining an approximate quantum circuit that produces a quantum state that is sufficiently close to the target quantum state by adaptively increasing or decreasing an initial number of T gates is described in more detail below with reference to FIGS. 2-4.

Alternatively, the circuit determination module 102 may be configured to define an approximate quantum circuit by directly optimizing a total number of available T gate, or by optimizing the particular configuration/allocation of the total number of available T gates to the quantum circuit, e.g., using an optimization routine such as simulated annealing. Example processes for directly optimizing an assignment of T gates is described below with reference to FIGS. 5 and 6.

Alternatively or in addition, the classical processors 104 may be configured to determine a quantum circuit that approximates a ground state of the quantum system by performing variational algorithms using quantum circuit parameters as a variational ansatz. Example processes for determining quantum circuits using variational techniques are described below with reference to FIGS. 2 and 5.

The quantum hardware 102 may include components for performing quantum computation. For example, the quantum hardware 102 may include a quantum system 120, control devices 116 for implementing a quantum circuit, e.g., quantum circuit 114, and one or more T factories 118.

The quantum system 120 may include one or more multi-level quantum subsystems, e.g., qubits or audits. In some implementations the multi-level quantum subsystems may be superconducting qubits, e.g., Gmon qubits. The type of multi-level quantum subsystems that the system 100 utilizes is dependent on the physical system of interest. For example, in some cases it may be convenient to include one or more resonators attached to one or more superconducting qubits, e.g., Gmon or Xmon qubits. In other cases ion traps, photonic devices or superconducting cavities (with which states may be prepared without requiring qubits) may be used. Further examples of realizations of multi-level quantum subsystems include fluxmon qubits, silicon quantum dots or phosphorus impurity qubits.

The multi-level quantum subsystems may be operated on via application of a quantum circuit 114. In these settings the multi-level quantum subsystems may be referred to as a register of qubits. The quantum circuit 114 may be defined by data received from the classical processors 104, e.g., data representing a specific sequence of quantum logic gates. The quantum circuit defined by the received data may be generated/realized using the one or more control devices 116.

The type of control devices 112 included in the quantum hardware 102 depend on the type of qubits included in the quantum system 110. For example, in some cases the control devices 112 may include devices that control the frequencies of qubits included in the quantum system 110, e.g., an excitation pulse generator and control lines that couple the qubits to the excitation pulse generator. The control devices 112 may then cause the frequency of each qubit to be adjusted towards or away from a quantum gate frequency of an excitation pulse on a corresponding control driveline. The control devices 112 may further include measurement devices, e.g., readout resonators. Measurement results obtained via measurement devices may be provided to the classical processors 104 for processing and analyzing.

The one or more T factories 118 store physical qubits for implementing T gates as part of the quantum circuit 114. In some implementations the T factories can be used to implement the T gates in series rather than in parallel, as described below with reference to FIG. 2.

Programming the Hardware

FIG. 2 is a flow diagram of an example process 200 for determining a quantum state. The example process 200 may be performed as part of an error corrected quantum computation, as described above. For convenience, the process 200 will be described as being performed by a system of one or more classical or quantum computing devices located in one or more locations. For example, a quantum computation system, e.g., the system 100 of FIG. 1, appropriately programmed in accordance with this specification, can perform the process 200.

The system receives data representing a target quantum state of a quantum system (step 202). For example, the quantum system may include a system of logical qubits that are encoded into multiple physical qubits. The target state of the quantum system may be defined as a lowest-energy quantum state resulting from application of a quantum circuit to the quantum system. For example, the target quantum state may correspond to a quantum state that minimizes a cost function, e.g., in machine learning and quantum simulation settings.

The quantum circuit may include multiple rotation operations specified by respective rotation angles that, together, represent a particular quantum computation. Implementing error corrected rotation operations may include approximating each rotation operation using a respective sequence of Hadamard quantum logic gates and T gates. The number of T gates included in each sequence of Hadamard quantum logic gates and T gates is dependent on the total number of available T gates and the rotation operations included in the circuit. A fixed number of T gates defines a respective set of discrete rotation operations that can be implemented exactly and be used to approximate the quantum circuit. In some implementations a fixed number of T gates may define multiple sets of discrete rotation operations that each approximate the quantum circuit and can be implemented exactly. That is, a fixed number of T gates can be arranged in multiple configurations or assignments, with each configuration or assignment approximating the quantum circuit. Different known techniques can be applied to determine the T gate configurations. For example, each rotation operation may be represented as a sequence of gates including: either a Hadamard gate H or nothing, followed by a string of T.H gates or S.H gates, where S represents an S gate and with no sequential pairs of S.H, ending with a T.H and an arbitrary Clifford gate.

As described above, implementing a T gate on a logical qubit may require a large number of additional physical qubits. Therefore, implementing the discrete rotation operations that approximate the quantum circuit may include accessing multiple T factories storing additional physical qubits, and implementing the discrete rotation operations using the logical qubits and the additional qubits. The total number of physical qubits operated by the system would therefore increase considerably.

To mitigate this problem, the system adaptively adjusts the number of T gates available to the quantum circuit to determine an approximate quantum circuit that produces quantum states that are sufficiently close to the target quantum state (step 204).

In some implementations determining an approximate quantum circuit may include incrementally adjusting the number of T gates available to the quantum circuit to determine an optimal, or near optimal, assignment of T gates. The optimal, or near optimal, assignment of T gates then defines the approximate quantum circuit. In this context, an assignment of T gates may be considered to be optimal if the action of the approximate quantum circuit on the quantum system is as close as possible to the action of the original quantum circuit (given the fixed total number of T gates).

For example, the system may iteratively define an updated circuit by incrementally increasing an initial number of T gates available to the quantum circuit. At each iteration, an energy expectation value of the quantum system after application of the updated circuit for the iteration to an initial state of the quantum system is determined. The iterative process may end when the energy expectation values converge. The final approximate quantum circuit may then be defined by a T gate assignment corresponding to the penultimate iteration.

As another example, the system may iteratively define an updated circuit by incrementally decreasing an initial number of T available to the quantum circuit. Example processes for incrementally adjusting the number of T gates available to a quantum circuit are described in more detail below with reference to FIGS. 3 and 4.

As another example, the system may define an updated quantum circuit by directly optimizing a total number of T gates assigned to the quantum circuit, or by optimizing the particular configuration/allocation of the total number of available T gates to the quantum circuit. Example processes for directly optimizing an assignment of T gates is described below with reference to FIGS. 5 and 6.

In some implementations the system may perform a variational algorithm to determine an adjusted quantum circuit that, when applied to the initial quantum state, approximates the ground state of the quantum system. That is, the system may apply the quantum circuit to the initial state of the quantum system to generate a variational ansatz wavefunction. The variational ansatz wavefunction is defined by the action of the quantum circuit on the initial state of the quantum state that may be trivial to prepare. For example, the variational ansatz wavefunction may be given by $|\phi(\vec{\theta})\rangle = U(\vec{\theta})|\phi\rangle$, where $|\phi\rangle$ represents the initial state of the quantum system, $U(\vec{\theta})$ represents the quantum circuit, and $\vec{\theta}$ represents (adjusted) circuit parameters (rotation angles) that approximate the quantum circuit.

The system may then perform a variational algorithm using the variational ansatz wavefunction to determine adjusted values of the one or more circuit parameters that define the adjusted quantum circuit that, when applied to the initial quantum state, approximates the ground state of the quantum system.

In these implementations, adaptively adjusting the number of T gates available to the quantum circuit, as described above at step 204, may include determining the approximate quantum circuit by adaptively adjusting a number of T gates available to the adjusted quantum circuit. Performing a variational algorithm in conjunction with process 200 may further optimize the determined quantum circuit, i.e., determine an approximate quantum circuit that produces quantum states with improved energy expectation values with fewer T gates.

The system applies the determined approximate quantum circuit to an initial quantum state of the quantum system to obtain an approximation of the target quantum state (step 206). The approximation of the target state may be used by the system to perform quantum computations, e.g., as part of an error corrected algorithm, or may be a result of a quantum computation. For example, the process 200 may be applied in a variational quantum simulation, e.g., preparing the ground state of a molecule.

Generally, computations that are realized using large numbers of T gates will need to be performed by implementing the T gates in parallel if the computation is to be completed in a reasonable amount of time. The process 200 for determining a target quantum state may be performed using a modest number of T factories. Therefore, T factories can be applied in series rather in parallel.

Iteratively Increasing the Number of T Gates

Figure 3:
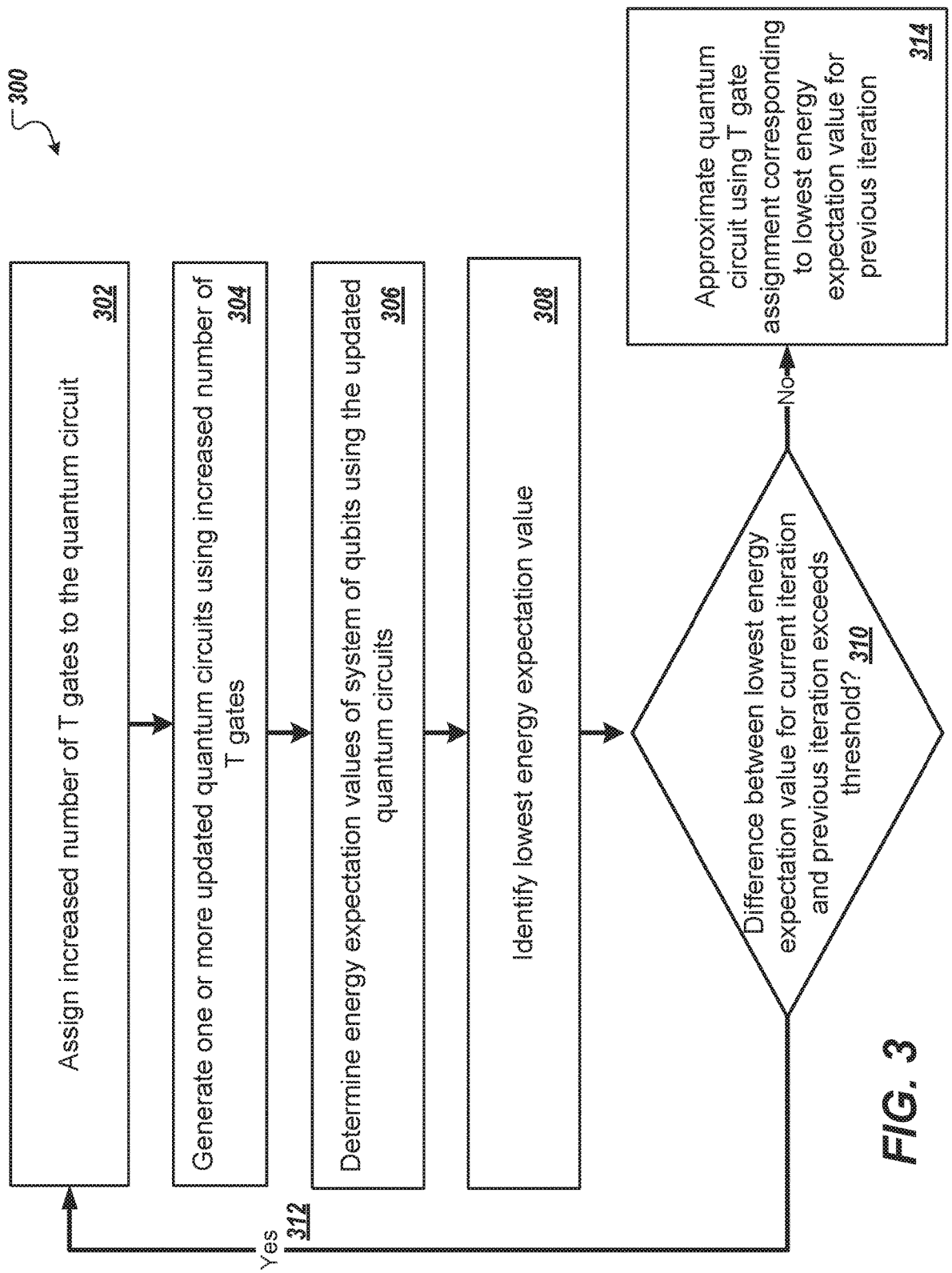
FIG. 3 is a flow diagram of an example iterative process for adaptively increasing the number of T gates assigned to a quantum circuit.

FIG. 3 is a flow diagram of an example process 300 for increasing the number of T gates available to a quantum circuit and testing when a sufficiently good energy estimate has been obtained to terminate the process. For convenience, the process 300 will be described as being performed by a system of one or more classical or quantum computing devices located in one or more locations. For example, a quantum computation system, e.g., the system 100 of FIG. 1, appropriately programmed in accordance with this specification, can perform the process 300.

The system assigns an initial number of T gates to the quantum circuit. The initial number of T gates may be a minimal number or a predefined number that is dependent on the size and depth of the quantum circuit.

The system iteratively increases the initial number of T gates assigned to the quantum circuit until termination criteria are met, as described below with reference to step 310. At each iteration, the system determines a number of T gates for the iteration (step 302).

The number of T gates for a current iteration is larger than the number of T gates for a previous iteration. For example, the number of T gates may increase by a predetermined fixed number of additional T gates at each iteration, e.g., in steps of 1, 5, or 10. As another example, the system may increase the number of T gates by selecting a predetermined percentage increase.

Alternatively or in addition the system may increase the total number of T gates by selecting a predetermined percentage increase of T gates for circuit parameters that correspond to different types of quantum logic gates. In some implementations the system may cap the number of T gates that may be assigned to particular circuit parameters, e.g., if application of a predetermined percentage increase assigns a number of T gates that exceeds a maximum number for a circuit parameter, the system may cap the number at the maximum and not assign further T gates to the circuit parameter.

The system generates one or more updated quantum circuits for the iteration using the determined number of T gates for the iteration (step 304). As described above, a fixed number of T gates defines one (or more) sets of discrete rotations that can be implemented exactly, the sets of discrete rotations approximating the quantum circuit. Each updated quantum circuit therefore corresponds to a different assignment of the determined number of T gates within the updated quantum circuit, i.e., a different set of discrete rotation operations that approximates the quantum circuit.

The system determines, for each updated quantum circuit, an energy expectation value of the quantum system for the iteration using the updated quantum circuit (step 306).

The system identifies a lowest determined energy expectation value of the quantum system (step 308).

The system determines whether the difference between the lowest determined energy expectation value for the iteration and a lowest determined energy expectation value for the previous iteration exceeds a predetermined threshold (step 310). The value of the predetermined threshold may be dependent on multiple factors, e.g., a target simulation accuracy, and may be considered a design parameter.

In response to determining that the difference exceeds the predetermined threshold, the system performs a subsequent iteration (step 312).

In response to determining that the difference does not exceed the predetermined threshold, the system approximates the quantum circuit using the T gate assignment that corresponds to a lowest energy expectation value for the previous iteration (step 314).

Iteratively Decreasing the Number of T Gates

Figure 4:
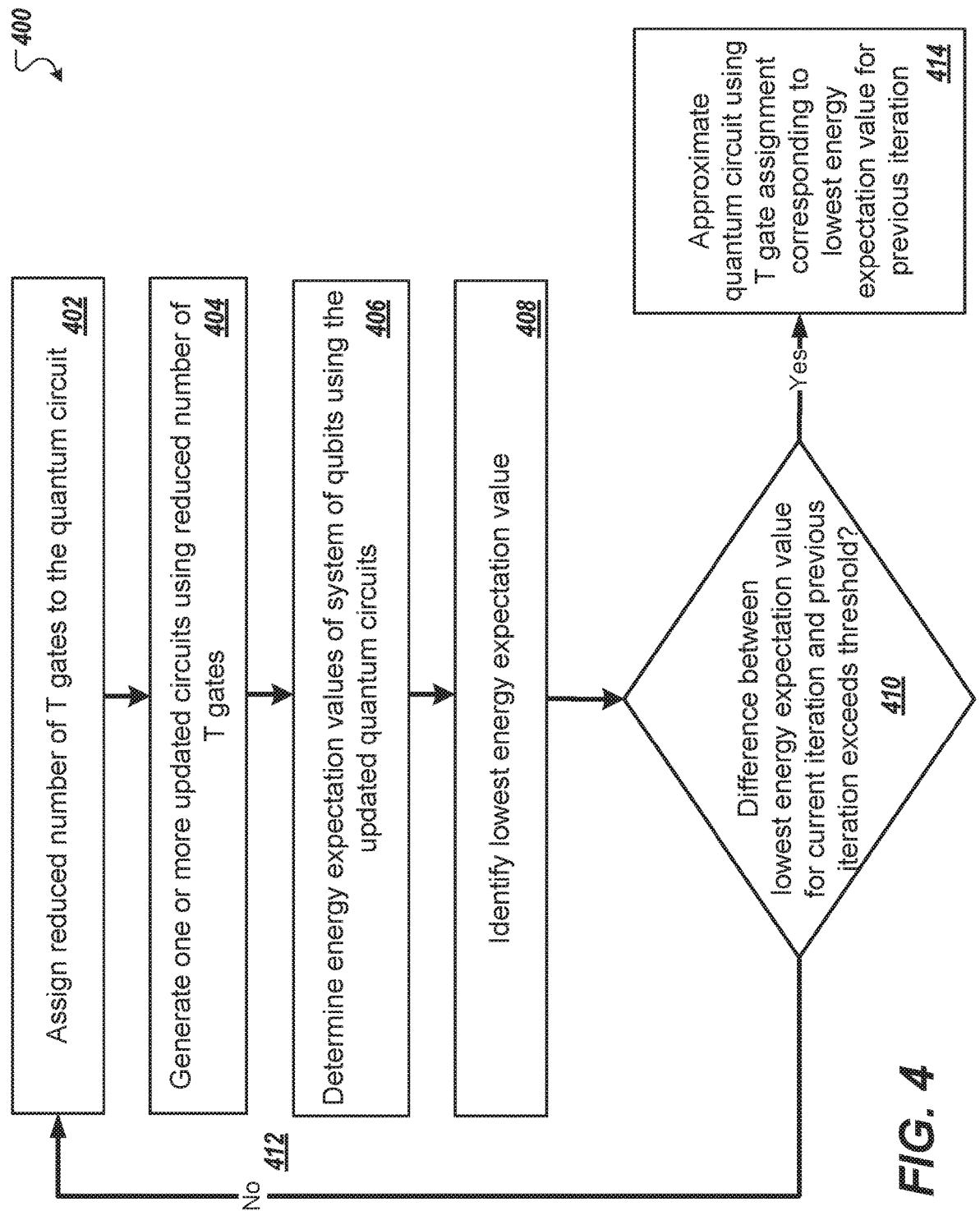
FIG. 4 is a flow diagram of an example iterative process for adaptively reducing the number of T gates assigned to a quantum circuit.

FIG. 4 is a flow diagram of an example iteration 400 for reducing a number of T gates available to a quantum circuit. For convenience, the process 400 will be described as being performed by a system of one or more classical or quantum computing devices located in one or more locations. For example, a quantum computation system, e.g., the system 100 of FIG. 1, appropriately programmed in accordance with this specification, can perform the process 400.

The system assigns an initial number of T gates to the quantum circuit. The initial number of T gates may be a maximum number or a predefined number that is dependent on the size and depth of the quantum circuit, the total number of T gates available for use by the system, and a predetermined target time frame within which computations are to be performed by the system.

The system iteratively decreases the initial number of T gates assigned to the quantum circuit until termination criteria are met, as described below with reference to step

410. At each iteration, the system determines a number of T gates for the iteration (step 402).

The number of T gates for a current iteration is lower than the number of T gates for a previous iteration. For example, the number of T gates may decrease by a predetermined fixed number at each iteration, e.g., in steps of 1, 5, or 10. As another example, the system may decrease the number of T gates by selecting a predetermined percentage reduction. Alternatively or in addition the system may decrease the total number of T gates by selecting a predetermined percentage decrease of T gates for circuit parameters that correspond to different types of quantum logic gates.

Alternatively or in addition, in some implementations the system may reduce the number of T gates assigned to the quantum circuit by identifying rotation operations in the quantum circuit that are respectively assigned a number of T gates that exceeds a predetermined threshold, and reducing the number of T gates made available to the identified circuit rotation operations. For example, the system may identify circuit parameters that are particularly costly, e.g., will require more than a predetermined acceptable amount of time to perform, and reduce the number of T gates made available to these costly parameters.

The system generates one or more updated quantum circuits for the iteration using the determined number of T gates for the iteration (step 404). As described above, a fixed number of T gates defines one (or more) sets of discrete rotations that can be implemented exactly, the sets of discrete rotations approximating the quantum circuit. Each updated quantum circuit therefore corresponds to a different assignment of the determined number of T gates within the updated quantum circuit, i.e., a different set of discrete rotation operations that approximates the quantum circuit.

The system determines, for each updated quantum circuit, an energy expectation value of the quantum system for the iteration using the updated quantum circuit (step 406).

The system identifies a lowest determined energy expectation value of the quantum system (step 408).

The system determines whether the difference between the lowest determined energy expectation value for the iteration and a lowest determined energy expectation value for the previous iteration exceeds a predetermined threshold (step 410). The value of the predetermined threshold may be dependent on multiple factors, e.g., target simulation accuracy, and may be considered a design parameter.

In response to determining that the difference does not exceed the predetermined threshold, i.e., that the lowest determined energy expectation value for the iteration does not significantly deviate from the determined energy expectation value for the previous iteration that was computed based on a higher number of T gates, the system performs a subsequent iteration (step 312).

In response to determining that the difference exceeds the predetermined threshold, the system approximates the quantum circuit using the T gate assignment that corresponds to a lowest energy expectation value for the previous iteration (step 314). That is, in response to determining that reducing the total number of T gates available to the quantum circuit causes the energy expectation value to significantly deviate (increase) from the determined energy expectation value for the previous iteration that was computed based on a higher number of T gates, the system determines that the total number of T gates for the iteration is not sufficient and approximates the quantum circuit using the T gate assignment that corresponds to a lowest energy expectation value for the previous iteration.

Adjusting T Gate Configurations Based on Variational Algorithms

Figure 5:
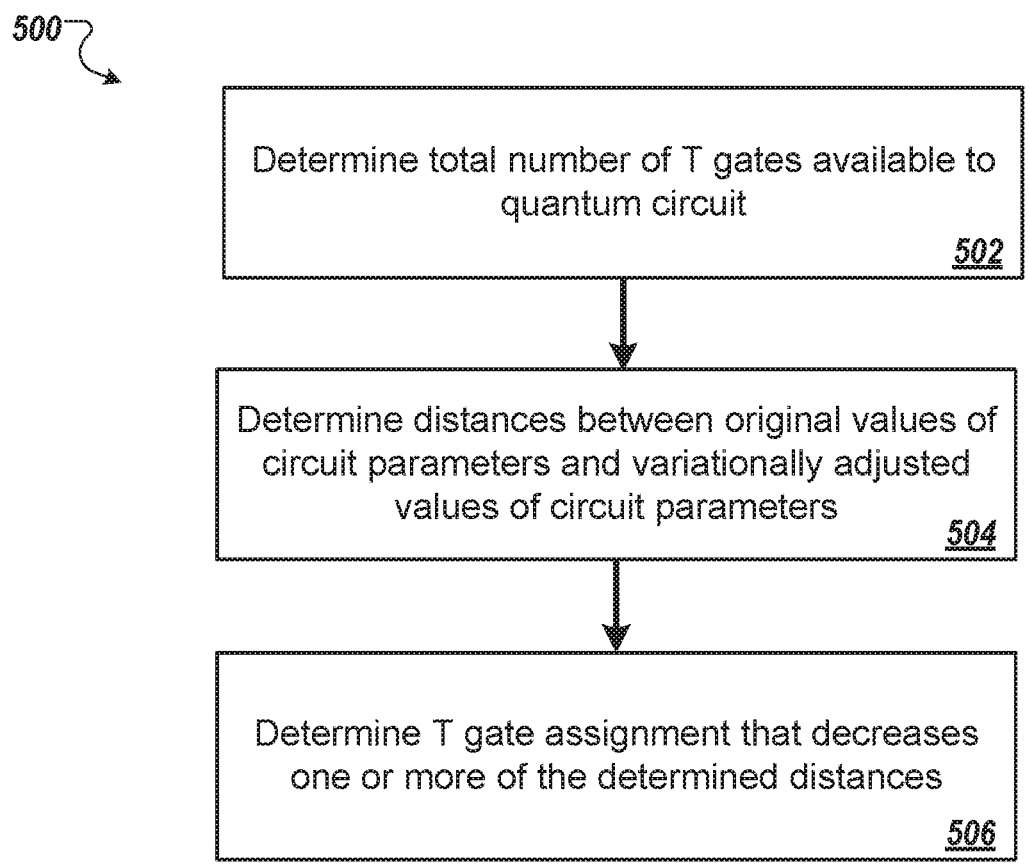
FIG. 5 is a flow diagram of an example process for adjusting T gate configurations based on variational algorithms.

FIG. 5 is a flow diagram of an example process 500 for adjusting a T gate configuration based on variational algorithms. For convenience, the process 500 will be described as being performed by a system of one or more classical or quantum computing devices located in one or more locations. For example, a quantum computation system, e.g., the system 100 of FIG. 1, appropriately programmed in accordance with this specification, can perform the process 500.

The system determines an initial number of T gates available to the circuit parameters in the quantum circuit (step 502).

The system determines respective distances between (i) original values of the quantum circuit parameters, and (ii) variationally adjusted values of circuit parameters after a variational algorithm has been performed, as described above with reference to FIG. 2. In some implementations the determined distances may include L2 norms.

The system determines an assignment or configuration of T gates that decreases one or more of the determined distances. In some implementations this may include fixing the initial number of T gates and determining an assignment of the initial number of T gates that reduces at least one of the determined distances. In other implementations the initial number of gates may be adjusted, e.g., reduced or increased, and an assignment of the adjusted total number of T gates that reduces at least one of the determined distances may be determined.

To determine an assignment or configuration of T gates, the system may represent the circuit parameters as points on the Bloch sphere. The number of T gates assigned to a parameter determines how many points are on the Bloch sphere. In some implementations the points may be located close to a target value (rotation angle). In this case, the system may determine that the parameter does not require many T gates. In other implementations, parameters may require more T gates. For example, if an angle $\theta_0$ can be represented by $t_0$ T gates, and after optimization the optimized angle is close enough to the angle $\theta_0$, it may be determined that no further T gates are necessary (or a fewer number of T gates may suffice). However, if the optimal angle is not close enough to the angle $\theta_0$, it may be determined that more T gates are needed.

Directly Adjusting T Gate Assignments

FIG. 6 is a flow diagram of an example process 600 for directly adjusting T gate assignments using discrete optimization techniques. For convenience, the process 600 will be described as being performed by a system of one or more classical or quantum computing devices located in one or more locations. For example, a quantum computation system, e.g., the system 100 of FIG. 1, appropriately programmed in accordance with this specification, can perform the process 600.

The system determines a fixed total number of T gates available to the quantum circuit (step 602). In some implementations the total number of T gates available to the circuit is dependent on the hardware included in the system, e.g., the number of T factories accessible to the system. In other implementations the total number of T gates available to the quantum circuit may be a target total number of T gates, e.g., a target number of T gates that is less than the total number of T gates included or available to the quantum hardware used by the system.

The system performs a discrete optimization routine to assign a particular configuration of T gates to the quantum circuit. For example, the system may apply a simulated annealing procedure to assign a particular configuration of T gates to the circuit parameters. In some implementations the assigned particular configuration of T gates may include all available T gates. In other implementations the assigned particular configuration of T gates may include a number of T gates that is less than the total number of available T gates.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A computer implemented method for approximating a target quantum state, the method comprising:
receiving data representing the target quantum state of a quantum system, wherein the target quantum state is defined as a result of applying a specific quantum circuit to an initial quantum state of the quantum system;
determining an approximate quantum circuit that approximates the specific quantum circuit by adaptively adjusting a number of T gates available to the specific quantum circuit; and
applying the determined approximate quantum circuit to the initial quantum state to obtain an approximation of the target quantum state.

2. The method of claim 1 wherein determining an approximate quantum circuit by adaptively adjusting a total number of T gates available to the quantum circuit comprises:
assigning an initial number of T gates to the quantum circuit; and
iteratively increasing the initial number of T gates assigned to the quantum circuit until termination criteria are met.

3. The method of claim 2, wherein iteratively increasing the number of T gates assigned to the quantum circuit, comprises, for each iteration:
determining a number of T gates for the iteration, the number of T gates for the iteration being larger than the number of T gates for the previous iteration;
generating one or more updated quantum circuits for the iteration using the determined number of T gates for the iteration, wherein each updated quantum circuit corresponds to a different assignment of the determined number of T gates within the updated quantum circuit;
determining, for each updated quantum circuit, an energy expectation value of the quantum system for the iteration using the updated quantum circuit;
identifying a lowest determined energy expectation value of the quantum system;
determining whether the difference between the lowest determined energy expectation value for the iteration and a lowest determined energy expectation value for the previous iteration exceeds a predetermined threshold; and in response to determining that the difference exceeds the predetermined threshold, performing a subsequent iteration.

4. The method of claim 3, further comprising:
in response to determining that the difference does not exceed the predetermined threshold, approximating the quantum circuit using a T gate assignment that corresponds to a lowest energy expectation value for the previous iteration.

5. The method of claim 1, wherein determining an approximate quantum circuit by adaptively adjusting a total number of T gates available to the quantum circuit comprises:
assigning an initial number of T gates to the quantum circuit; and
iteratively decreasing the initial number of T gates assigned to the quantum circuit until termination criteria are met.

6. The method of claim 5, wherein iteratively decreasing the number of T gates available to the quantum circuit comprises, for each iteration:
determining a number of T gates for the iteration, the number of T gates for the iteration being smaller than the number of T gates for the previous iteration;
generating one or more updated quantum circuits for the iteration using the determined number of T gates for the iteration, wherein each updated quantum circuit corresponds to a different assignment of the determined number of T gates within the updated quantum circuit;
determining, for each updated quantum circuit, an energy expectation value of the quantum system for the iteration using the updated quantum circuit;
identifying a lowest determined energy expectation value of the quantum system;
determining whether the difference between the lowest determined energy expectation value for the iteration and a lowest determined energy expectation value for the previous iteration exceeds a predetermined threshold; and
in response to determining that the difference does not exceed the predetermined threshold, performing a subsequent iteration.

7. The method of claim 6, further comprising:
in response to determining that the difference exceeds the predetermined threshold, approximating the quantum circuit using a T gate assignment that corresponds to a lowest energy expectation value for the previous iteration.

8. The method of claim 1, wherein the method further comprises performing a variational algorithm to determine an adjusted quantum circuit that, when applied to the initial quantum state, approximates the ground state of the quantum system, and wherein determining an approximate quantum circuit by adaptively adjusting a number of T gates available to the quantum circuit comprises:
determining the approximate quantum circuit by adaptively adjusting a number of T gates available to the adjusted quantum circuit.

9. The method of claim 8, adaptively adjusting a number of T gates available to the adjusted quantum circuit comprises:
determining respective distances between (i) values of circuit parameters, and (ii) variationally adjusted values of circuit parameters; and
determine a T gate assignment that reduces one or more of the determined distances.

10. The method of claim 9, wherein the distances comprise L2 norms.

11. The method of claim 1, wherein determining an approximate quantum circuit by adaptively adjusting a number of T gates available to the quantum circuit comprises:
fixing the total number of T gates available to the quantum circuit;
performing a discrete optimization routine to assign a particular configuration of the fixed total number of T gates to the adjusted circuit parameters.

12. The method of claim 11, wherein the discrete optimization routine comprises simulated annealing.

13. The method of claim 1, wherein the quantum circuit comprises one T factory storing physical qubits for implementing T gates.

14. The method of claim 13, wherein applying the determined approximate quantum circuit to the initial quantum state to obtain an approximation of the target quantum state comprises using the T factory to implement T gates in series.

15. An apparatus comprising:
quantum hardware comprising:
a quantum system;
one or more control devices configured to generate and apply quantum circuits to the quantum system; and
one or more classical processors;
wherein the apparatus is configured to perform operations for approximating a target quantum state, the operations comprising:
receiving data representing the target quantum state of a quantum system, wherein the target quantum state is defined as a result of applying a specific quantum circuit to an initial quantum state of the quantum system;
determining an approximate quantum circuit that approximates the specific quantum circuit by adaptively adjusting a number of T gates available to the specific quantum circuit and
applying the determined approximate quantum circuit to the initial quantum state to obtain an approximation of the target quantum state.

16. The apparatus of claim 15, wherein the quantum hardware comprises a T factory storing physical qubits for implementing T gates.

17. The apparatus of claim 16, wherein applying the determined approximate quantum circuit to the initial quantum state to obtain an approximation of the target quantum state comprises using the T factory to implement T gates in series.

* * * * *